United States Patent [19]
Lynch

[11] 3,944,881
[45] Mar. 16, 1976

[54] VERTICAL CENTERING CONTROL CIRCUIT

[75] Inventor: David P. Lynch, Driver, Va.

[73] Assignee: General Electric Company, Portsmouth, Va.

[22] Filed: May 10, 1974

[21] Appl. No.: 469,010

[52] U.S. Cl. ................................................. 315/398
[51] Int. Cl.² ........................................ H01J 29/54
[58] Field of Search ..................................... 315/398

[56] References Cited
UNITED STATES PATENTS

| | | | |
|---|---|---|---|
| 2,637,832 | 5/1953 | Rogers | 315/398 |
| 3,609,219 | 1/1970 | Diehl | 315/398 |
| 3,733,513 | 5/1973 | Yoshikawa | 315/398 |

*Primary Examiner*—T. H. Tubbesing

[57] ABSTRACT

Utilization of a diode in the input of the vertical deflection drive amplifier serves to render the amplifier insensitive to power supply variation and shortens the response time of the amplifier to changes in the vertical centering circuit. In one embodiment the diode is connected in series with the variable terminal of the centering potentiometer in the input of the vertical drive amplifier. In a second embodiment, wherein the vertical deflection drive amplifier includes a differential amplifier, the diode is connected to one input of the amplifier and the centering circuit is connected to the second input of the amplifier. In both embodiments the diode forms part of a time constant circuit which controls the linearity of the sweep signal applied to the input of the amplifier and also controls the response time of the amplifier to DC voltage level change.

4 Claims, 3 Drawing Figures

VERTICAL CENTERING CONTROL CIRCUIT

BACKGROUND OF THE INVENTION

The present invention relates to control circuits for television receivers. More particularly, the invention relates to an improved vertical centering control circuit for a television receiver.

In the vertical deflection circuit for a television receiver, a sawtooth sweep signal is applied to the deflection drive amplifier by means of a time constant circuit which has a long time constant in order to linearize the ramp portions of this 60HZ sweep signal. The long time constant, however, produces deleterious effects on the deflection circuit. First of all, the long time constant affects the response time of the vertical deflection drive amplifier to changes in the centering control voltage. Thus, when the television receiver is being assembled and the picture on the screen is being vertically centered, an adjustment of the centering control results in a substantial time delay before the picture position fully responds to the adjustment. Of course, if the initial adjustment did not accomplish the desired positioning of the picture, additional adjustments will have to be made, each adjustment occasioning a delay before its full effect is realized. These delays are, of course, costly in a high volume production line.

Secondly, variation in the voltage level of the power supply for the vertical deflection amplifier results in momentary picture position shift. This is due to the fact that shift in the voltage level is promptly tracked by the vertical deflection drive amplifier, but the corresponding change in the centering voltage level is not promptly responded to due to the delay occasioned by the aforementioned time constant circuit.

The third problem resulting from the long time constant circuit is the expense associated with the large-valued components, especially the capacitor incorporated therein.

It is contemplated as an object of the present invention to avoid the aforementioned problems resulting from the time constant circuit of the prior art. This is achieved by replacing the resistor in the time constant circuit with a diode or other device having a diode characteristic, namely, a device having a high impedance under one bias condition and a low impedance under a second bias condition. In one embodiment of the present invention, the time constant circuit including the diode is utilized to couple not only the sweep signal to the deflection drive amplifier but also to couple the vertical centering control to the amplifier. The positioning of the diode in the circuit is such that both the high impedance and low impedance states of the device is employed so that the amplifier will quickly respond to DC voltage changes while at the same time a long time constant is provided for linearity of the sweep signal. In a second embodiment, the diode and the centering control interact through the two input terminals of a differential amplifier input stage for the deflection drive amplifier.

Accordingly, it is an object of the present invention to provide a dual purpose time constant circuit for the vertical deflection drive amplifier of a television receiver which enables the amplifier to promptly respond to DC voltage level change and also to linearize the sweep signal applied to the amplifier.

Another object of the present invention is to provide a time constant circuit employing a diode to provide a long time constant to linearize the sawtooth sweep signal applied to the vertical deflection drive amplifier and also to isolate this amplifier from the effects of the long time constant during DC supply voltage level changes.

These and other objects and advantages of the present invention will be more readily understood from the following detailed description of the invention taken in conjunction with the drawings, in which.

Figure 1:
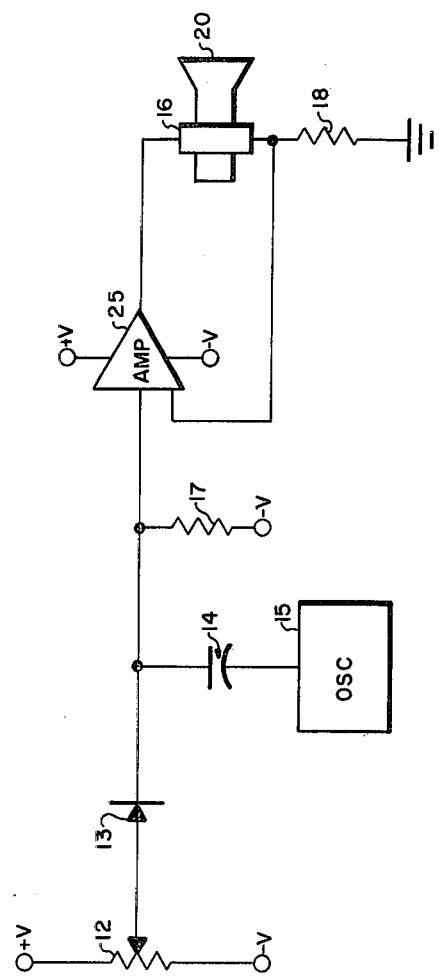
FIG. 1 is a partial block and partial circuit diagram of a first embodiment of the present invention.

Referring now to the drawings in which like reference numerals refer to like parts throughout, there is shown in FIG. 1 the cathode ray tube 20 of a television receiver. This cathode ray tube may be of the type used in monochrome television receivers or in color television receivers. In the Figure it is shown that the cathode ray tube is provided with a deflection yoke 16 mounted thereon for deflecting the one or more electron beams generated within the cathode ray tube to cause the picture to be painted by the repetitive horizontal and vertical scanning of the electron beams across the face of the cathode ray tube. For the purpose of the present invention it is sufficient to note that the deflection yoke 16 includes vertical deflection windings. A resistor 18 is shown connected to one terminal of the windings so that the vertical deflection current passing through this resistor develops a voltage thereacross representative of the waveshape of the deflection signal.

FIG. 1 shows oscillator 15 which generates a sawtooth type deflection signal. This signal is applied to vertical deflection drive amplifier 25 wherein it is shaped and amplified and in turn applied to the vertical deflection windings on the yoke 16. The sawtooth signal generated by oscillator 15 is appropriately synchronized by a synchronizing signal derived from the video signal received by the television receiver.

FIG. 1 shows that the amplifier 25 is a two input terminal amplifier, one input receiving the sawtooth signal and the second terminal receiving a feedback input to facilitate shaping of the sawtooth waveform for proper vertical deflection. It should be noted that while a lead is shown from resistor 18 to the input of amplifier 25, shaping such as S-correction of each sawtooth pulse may be occasioned in the feedback path or in the amplifier. Also it is not essential that the feedback be applied to the input of the amplifier but may be applied at some intermediate point.

There is also shown in FIG. 1 a vertical position centering control potentiometer 12 connected between the supply voltage +V and −V which ordinarily and as shown is the same supply voltage applied to the amplifier 25. The controllable terminal of the potentiometer is coupled to the input of amplifier 25 by means of a time constant circuit including diode 13, capacitor 14 and resistor 17. The time constant circuit, primarily made up of diode 13 and capacitor 14, acts as a time constant coupling circuit to couple the sawtooth signal and also the DC bias voltage occasioned by the centering control to the input of amplifier 25. Diode 13 clamps the input of the amplifier to the centering control voltage and at the same time clamps the oscillator output to this voltage. Thus, each of the excursions of the sawtooth signal, being more positive than the voltage at the anode of diode 13, cause this device to be back-biased to provide a very high resistance and therefore a long time constant to these sawtooth excursions creating the desired linearity. Because of the very high level resistance of the diode when back-biased, a much lower value of capacitor 14 may be employed than that used in circuits of the prior art where a resistor was used instead of the diode 13.

When the variable terminal of centering control 12 is moved upward, to apply a more positive voltage to the input of amplifier 25, diode 13 is forward-biased and presents a low resistance so that current freely flows to charge capacitor 14 to the new DC level and the amplifier 25 is promptly provided with a new level bias voltage. The resistor 17 connected between the input to the amplifier 25 and the −V supply is optional and serves as an additional bleeder resistance to further improve the response time. When the potentiometer 12 is moved to a more negative voltage, the diode 13 is reversed biased so that it is substantially out of the circuit and capacitor 14 is promptly discharged through the input impedance of the amplifier until it reaches the new voltage setting.

Thus it can be seen that diode 13 due to its position in the circuit is back-biased by each excursion of the sawtooth signal and yet permits prompt response of the amplifier to centering control adjustment.

It also should be noted that inasmuch as the voltage supply for the amplifier 25 is the same supply as supplied to the potentiometer 12, changes in this supply are reflected substantially immediately as a change in the centering voltage so that the position of the picture on the screen of the cathode ray tube does not appear to change when the supply to the amplifier and the centering control changes.

Figure 2:
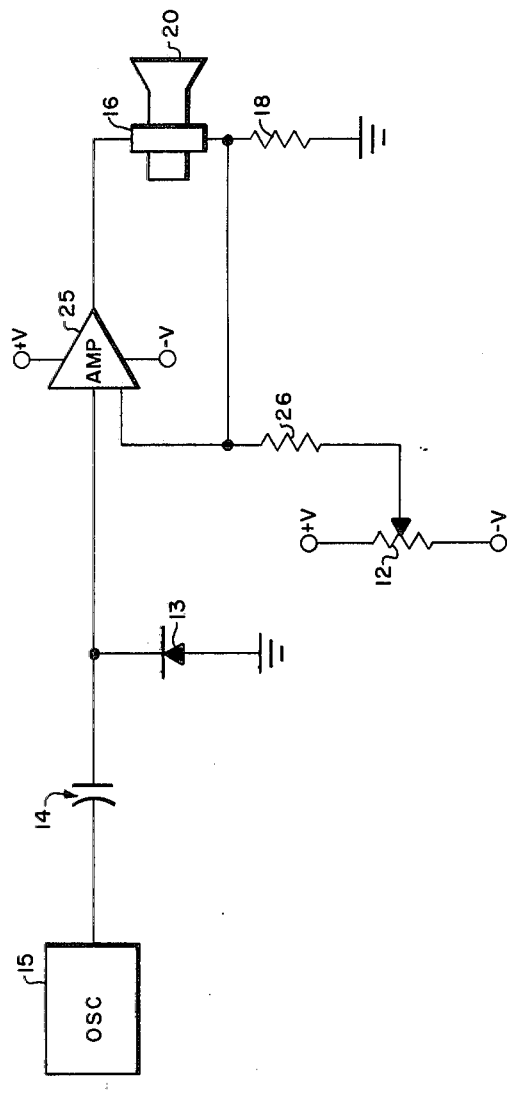
FIG. 2 is a partial block and partial circuit diagram of a second embodiment of the present invention.

Referring now to FIG. 2, there is shown a second embodiment of the invention in which the oscillator and time constant circuit are connected to one input terminal of the amplifier 25 while the vertical centering control is connected to the second input terminal. Further explanation of the embodiment of FIG. 2 can be foregone until the interrelationship of the time constant circuit and the vertical centering control is described. This relationship is readily-observed by reference to FIG. 3.

Figure 3:
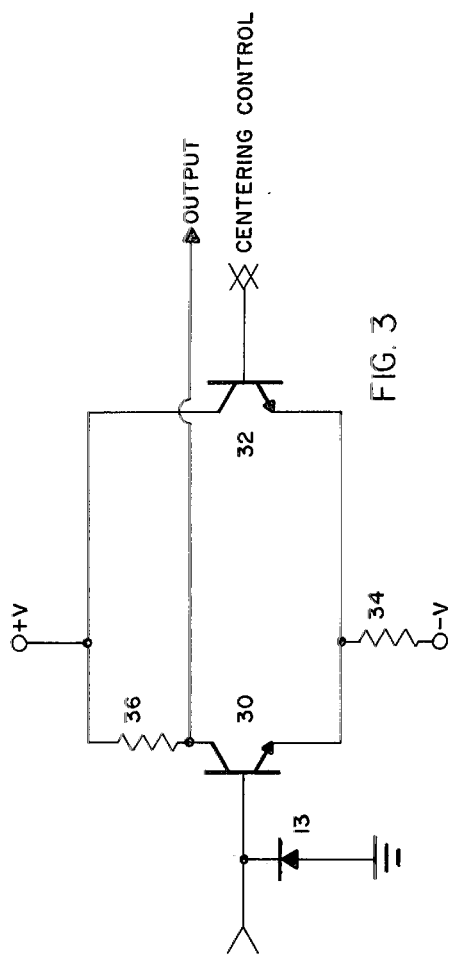
FIG. 3 is a circuit diagram of a skeleton differential amplifier which may be used in the embodiment of FIGS. 1 and 2.

As shown in FIG. 3, the input stage of the amplifier 25 may comprise a differential amplifier including transistors 30 and 32, the base of transistor 30 connected to the diode 13 and the base of transistor 32 connected to the variable terminal of the centering control potentiometer 12. Resistor 36 connects the collector of transistor 30 to the source of positive supply voltage +V, the output of this amplifier stage being taken from the collector of transistor 30. Resistor 34 serves as the common emitter resistance for the two transistors.

Normally, due to the common emitter connection, the two base inputs of a differential amplifier track each other. A rise in the voltage at the base of one transistor causes a higher voltage to appear at each emitter and therefore at the base of the second transistor. However, in the circuit shown, the base of transistor 30 is clamped to ground so that the amplifier responds promptly to the differential between the DC voltages at the two bases. The diode clamp thus acts to isolate the centering control from the effects of the time constant circuit even though the centering control and time constant circuit are coupled together through the common emitter circuit of the differential amplifier.

Referring now to FIG. 2, the circuit is identical to that shown in FIG. 1 with the exception that in FIG. 2 the oscillator and time constant circuit are connected to one input terminal of amplifier 25 and the vertical centering control potentiometer 12 is connected to the second input terminal of the amplifier. Diode 13 in FIG. 2 clamps the first input of this amplifier directly to ground to establish one DC reference level for this amplifier. Centering control potentiometer 12 is connected to the second input terminal by resistor 26. Thus the differential between the DC voltages at the two input terminals serves as the bias supply for amplifier 25. The time constant circuit including capacitor 14 and diode 13 also couples the sawtooth voltage outputted by oscillator 15 to the first input terminal of the amplifier. The positive going sweep portion of each ramp of the sawtooth waveform insures reverse biasing of the diode 13 so that the long time constant is realized. Diode 13 remains reverse biased except for the very short period at the end of the flyback or return portion of the sawtooth waveform, during which time the DC level of the voltage on capacitor 14 is restored by conduction through diode 13.

From the foregoing it can be seen that replacing the normal resistor of the time constant circuit for the vertical deflection drive amplifier with a diode enables a dual time response to be recognized. DC voltage changes can be responded to substantially immediately while at the same time the polarity and positioning of the diode in the circuit is such that the sweep signal applied to the amplifier sees a long time constant for optimum linearity. While the two embodiments shown illustrate a single diode in the time constant circuit, it should be recognized that any device having a diode characteristic, namely, one whose resistance change depends upon the polarity of the bias thereacross, can be used without departing from the spirit of the present invention. In addition, while a manually adjustable centering control is shown, it should be noted that an automatic centering control may be utilized. Accordingly, it is intended that the scope of the present invention be limited only by the claims appended hereto.

What is claimed and desired to be secured by Letters Patent of the United States is:

1. In a television receiver having a cathode ray tube and a deflection circuit including vertical deflection windings for deflecting the one or more electron beams of the cathode ray tube in a vertical direction, a vertical deflection drive circuit comprising:

a source of sweep signal varying at the desired vertical sweep rate, an amplifier having an input and an output, said input being responsive to said sweep signal enabling said output to apply an amplified sweep signal to said vertical deflection windings, a vertical centering control coupled to said input to apply a controllable DC voltage to said amplifier, and time constant means coupled to said source and to said input, said time constant means including means having the characteristic of a diode to shorten the response time of said amplifier to vertical centering control adjustment and to provide a time constant for said sweep signal of sufficient duration to linearize the shape of the sweep portions thereof.

2. The invention as recited in claim 1 wherein said input comprises first and second input terminals, and said means having the characteristic of a diode is a diode, said diode being connected to the first input terminal to clamp said first input terminal to a DC reference voltage.

3. The invention recited in claim 2 wherein said diode couples said vertical centering control to said first input terminal to clamp said first input terminal to said controllable DC voltage.

4. The invention recited in claim 2 wherein said vertical centering control is connected to said second input terminal and said diode clamps said first input terminal to a fixed DC reference voltage.

* * * * *